US008076052B2

(12) United States Patent
Tao et al.

(10) Patent No.: US 8,076,052 B2
(45) Date of Patent: *Dec. 13, 2011

(54) POSITIVE-WORKING IMAGEABLE ELEMENTS WITH CHEMICAL RESISTANCE

(75) Inventors: Ting Tao, Fort Collins, CO (US); Jayanti Patel, Fort Collins, CO (US); Eric E. Clark, Loveland, CO (US)

(73) Assignee: Eastman Kodak Company, Rochester, NY (US)

( * ) Notice: Subject to any disclaimer, the term of this patent is extended or adjusted under 35 U.S.C. 154(b) by 737 days.

This patent is subject to a terminal disclaimer.

(21) Appl. No.: 11/971,941

(22) Filed: Jan. 10, 2008

(65) Prior Publication Data

US 2009/0181326 A1 Jul. 16, 2009

(51) Int. Cl.
*G03F 1/00* (2006.01)
*G03F 7/00* (2006.01)

(52) U.S. Cl. ............... 430/270.1; 430/273.1; 430/281.1; 430/283.1; 101/453

(58) Field of Classification Search ............... 430/270.1, 430/302
See application file for complete search history.

(56) References Cited

U.S. PATENT DOCUMENTS

| | | | | |
|---|---|---|---|---|
| 6,261,740 | B1 | 7/2001 | Nguyen et al. | |
| 6,520,086 | B1 * | 2/2003 | Newington et al. | 101/457 |
| 7,041,427 | B2 * | 5/2006 | Loccufier et al. | 430/270.1 |
| 7,074,842 | B2 * | 7/2006 | Chung et al. | 523/160 |
| 7,081,322 | B2 * | 7/2006 | Ray et al. | 430/5 |
| 7,300,726 | B1 * | 11/2007 | Patel et al. | 430/15 |

FOREIGN PATENT DOCUMENTS

| | | |
|---|---|---|
| JP | 5-181275 | 7/1993 |
| JP | 05181275 A * | 7/1993 |

* cited by examiner

*Primary Examiner* — Cynthia Kelly
*Assistant Examiner* — Chanceity Robinson
(74) *Attorney, Agent, or Firm* — J. Lanny Tucker

(57) ABSTRACT

Single- and multi-layer positive-working imageable elements include a first polymeric binder that is soluble in an alkaline developer upon exposure to imaging radiation and a radiation absorbing compound. The first polymeric binder comprises a backbone to which are attached pendant groups represented by the following Structure (I):

(I)

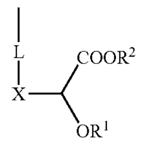

wherein $R^1$ and $R^2$ are independently hydrogen or alkyl groups having 1 to 8 carbon atoms or aryl groups having 6 or 10 carbon atoms in the carbocyclic ring, L is a direct bond or a linking group having at least 1 carbon atom and optionally one or more nitrogen, oxygen, and sulfur atoms in the linking chain, and X is oxy, thio, or —NR— wherein R is hydrogen or an alkyl group having 1 to 8 carbon atoms or an aryl group having 6 or 10 carbon atoms in the carbocyclic ring.

11 Claims, No Drawings

POSITIVE-WORKING IMAGEABLE ELEMENTS WITH CHEMICAL RESISTANCE

FIELD OF THE INVENTION

This invention relates to positive-working imageable elements having improved resistance to chemicals using in development and printing. It also relates to methods of imaging and developing these imageable elements particularly to provide lithographic printing plates.

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. For example, the ink can be first transferred to an intermediate blanket that in turn is used to transfer the ink to the surface of the material upon which the image is to be reproduced.

Imageable elements useful to prepare lithographic printing plates typically comprise an imageable layer applied over the hydrophilic surface of a substrate. The imageable layer includes one or more radiation-sensitive components that can be dispersed in a suitable binder. Alternatively, the radiation-sensitive component can also be the binder material. Following imaging, either the imaged regions or the non-imaged regions of the imageable layer are removed by a suitable developer, revealing the underlying hydrophilic surface of the substrate. If the imaged regions are removed, the element is considered as positive-working. Conversely, if the non-imaged regions are removed, the element is considered as negative-working. In each instance, the regions of the imageable layer (that is, the image areas) that remain are ink-receptive, and the regions of the hydrophilic surface revealed by the developing process accept water and aqueous solutions, typically a fountain solution, and repel ink.

Direct digital imaging has become increasingly important in the printing industry. Imageable elements for the preparation of lithographic printing plates have been developed for use with infrared lasers. Thermally imageable, multi-layer elements are described, for example, in U.S. Pat. No. 6,294,311 (Shimazu et al.), U.S. Pat. No. 6,352,812 (Shimazu et al.), U.S. Pat. No. 6,593,055 (Shimazu et al.), U.S. Pat. No. 6,352,811 (Patel et al.), and U.S. Pat. No. 6,528,228 (Savariar-Hauck et al.), and U.S. Patent Application Publication 2004/0067432 A1 (Kitson et al.). U.S. Patent Application Publication 2005/0037280 (Loccufier et al.) describes heat-sensitive printing plate precursors that comprise a phenolic developer-soluble polymer and an infrared radiation absorbing agent in the same layer.

Additional positive-working thermally imageable elements are described and used for making lithographic printing plates using various developers in U.S. Pat. No. 6,200,727 (Urano et al.), U.S. Pat. No. 6,358,669 (Savariar-Hauck et al), and U.S. Pat. No. 6,534,238 (Savariar-Hauck et al.). In some instances, such imageable elements are developed using low pH developers when the upper layer includes novolak resins and dissolution suppressing agents.

Single-layer, positive-working imageable elements are described for example, in U.S. Pat. No. 6,280,899 (Hoare et al.), U.S. Pat. No. 6,391,524 (Yates et al.), U.S. Pat. No. 6,485,890 (Hoare et al.), U.S. Pat. No. 6,558,869 (Hearson et al.), U.S. Pat. No. 6,706,466 Parsons et al.), U.S. Pat. No. 7,041,427 (Loccufier et al.), and U.S. Patent Application Publication 2006/0130689 (Muller et al.).

Copending and commonly assigned, U.S. Ser. No. 11/686,981 (filed Mar. 16, 2006 by Savariar-Hauck et al.) describes and claims a method of processing using low pH developers in which the processed elements contain certain phenolic resins in the upper layer. Other imaged elements developable in low pH developers are described in U.S. Pat. No. 6,555,291 (Savariar-Hauck).

U.S. Pat. No. 6,520,086 (Newington et al.) describes the preparation of lithographic printing plates by ink jet deposition of an oligomer prepared by acrylamidoglycolic acid.

Other positive-working single and multi-layer imageable elements containing various unique polymeric binders are described in U.S. Pat. No. 7,247,418 (Saraiya et al.) and U.S. Pat. No. 7,300,726 (Patel et al.).

Problem to be Solved

While many of the known positive-working imageable elements provide desired imaging and developing characteristics, there is a continuing need to improve various properties such as resistance to pressroom chemicals and post-bakeability (bakeability after development).

SUMMARY OF THE INVENTION

This invention provides a positive-working imageable element comprising a substrate having thereon a layer comprising a first polymeric binder that is soluble in an alkaline developer upon exposure to imaging infrared radiation, the element further comprising an infrared radiation absorbing compound, wherein the first polymeric binder comprises a backbone to which are attached pendant groups represented by the following Structure (I):

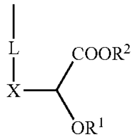

(I)

wherein $R^1$ and $R^2$ are independently hydrogen or alkyl groups having 1 to 8 carbon atoms or aryl groups having 6 or 10 carbon atoms in the carbocyclic ring, L is a direct bond or a linking having at least 1 carbon atom and optionally one or more nitrogen, oxygen, and sulfur atoms in the linking chain, and X is oxy, thio, or —NR— wherein R is hydrogen or an alkyl group having 1 to 8 carbon atoms or an aryl group having 6 or 10 carbon atoms in the carbocyclic ring.

In some embodiments, the layer containing the first polymeric binder is the only imageable layer and that layer also comprises the infrared radiation absorbing compound that is an infrared radiation absorbing dye that is present in an amount of from about 0.5 to about 30 weight %.

For example, a positive-working, single-layer, infrared radiation-sensitive imageable element of this invention comprises a hydrophilic aluminum-containing substrate having thereon an imageable layer comprising an infrared radiation absorbing dye in an amount of from about 1 to about 30 weight %, and a first polymeric binder in an amount of from about 5 to about 20 weight % and that is represented by the following Structure (II):

$$-(A)_x-(B)_y- \quad (II)$$

wherein A represents recurring units comprising the pendant groups represented by Structure (I) below, x is from about 10 to about 70 weight %, and y is from about 30 to about 90 weight %,

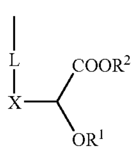

(I)

wherein $R^1$ and $R^2$ each hydrogen, L is a direct bond or comprises one or more alkylene groups having 1 to 4 carbon atoms, —C(═O)—, or —S(═O)O— groups, and X is oxy or —NH—, and B represents recurring derived from one or more styrenic monomers, vinyl carbazole, (meth)acrylamides, (meth) acrylic acids or esters thereof, (meth)acrylonitriles, vinyl acetate, maleic anhydride, N-substituted phenylmaleimide, vinyl pyridine, vinyl pyrrolidone, and vinyl trimethoxysilane, or any combination thereof.

In still other embodiments, the imageable element comprises, on the substrate, in order:

an inner layer comprising the infrared radiation absorbing compound that is an infrared radiation sensitive dye that is present in an amount of from about 0.5 to about 30 weight %, and the first polymeric binder that is present in the inner layer in an amount of from about 50 to about 99.5 weight %, and an ink receptive outer layer comprising a second polymeric binder that is different than the first polymeric binder, and is soluble or dispersible in an alkaline developer only after exposure to imaging radiation.

For example, positive-working, multi-layer, infrared radiation-sensitive imageable elements of this invention comprise a hydrophilic aluminum-containing substrate having thereon:

an inner layer comprising an infrared radiation absorbing dye that is present in an amount of from about 1 to about 30 weight %, and a first polymeric binder that is present in an amount of from about 60 to about 90 weight %, and an ink receptive outer layer comprising a second polymeric binder that is different than the first polymeric binder, and is soluble or dispersible in an alkaline developer only after exposure to imaging radiation, the first polymeric binder being represented by the following Structure (II):

$$-(A)_x-(B)_y— \quad \text{(II)}$$

wherein A represents recurring units comprising the pendant groups represented by Structure (I) below, x is from about 10 to about 70 weight %, and y is from about 30 to about 90 weight %,

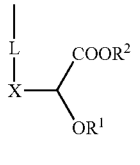

(I)

wherein $R^1$ and $R^2$ each hydrogen, L is a direct bond or comprises one or more alkylene groups having 1 to 4 carbon atoms, —C(═O)—, or —S(═O)O— groups, and X is oxy or —NH—, and B represents recurring derived from one or more styrenic monomers, vinyl carbazole, (meth)acrylamides, (meth) acrylic acids or esters thereof, (meth)acrylonitriles, vinyl acetate, maleic anhydride, N-substituted phenylmaleimide, vinyl pyridine, vinyl pyrrolidone, and vinyl trimethoxysilane, or any combination thereof.

The imageable elements of this invention can be a positive-working lithographic printing plate precursor wherein the substrate has a hydrophilic surface, and wherein the imageable layer is soluble in an alkaline developer only after exposure to infrared imaging radiation.

This invention also provides a method of making an imaged element comprising:

A) imagewise exposing the imageable element of the invention to provide both exposed and non-exposed regions in the imageable element, B) developing the imagewise exposed imageable element to remove predominantly only the exposed regions, and C) optionally baking the imaged and developed element.

The present invention includes positive-working elements having only a single imageable layer or multiple imageable layers (such as inner and outer imageable layers). These elements provide imaged elements, such as lithographic printing plate precursors, that exhibit improved resistance to chemicals encountered during development and printing. In addition, the imaged and developed elements exhibit improved “post-bakeability”, meaning that they show even further improved chemical resistance after post-baking. These advantages are achieved by incorporating the pendant groups defined by Structure (I) noted above in the polymeric binder of one or more imageable layers. This pendant group can include carboxylic acid groups that also aid in the developability of the imaged elements, thereby avoiding the need to incorporate other carboxylic acid groups within the polymeric binder.

DETAILED DESCRIPTION OF THE INVENTION

Definitions

Unless the context indicates otherwise, when used herein, the terms “imageable element”, “positive-working imageable element”, and “printing plate precursor” are meant to be references to embodiments of the present invention.

In addition, unless the context indicates otherwise, the various components described herein such as “first polymeric binder”, “second polymeric binder”, “dissolution inhibitor”, “coating solvent”, “radiation absorbing compound”, and similar terms also refer to mixtures of such components. Thus, the use of the article “a” or “an” is not necessarily meant to refer to only a single component.

By “single-layer” imageable element, we mean an imageable element of this invention that has only a single layer needed for providing an image. The first polymeric binder (defined below) would be located in this single imageable layer that is usually the outermost layer. However, such elements may comprise additional non-imaging layers on either side of the substrate.

By “multi-layer” imageable element, we mean an imageable element of this invention that has at least two layers required for providing an image, for example, “inner” and “outer” layers as described below. However, such elements may comprise additional non-imaging layers on either side of the substrate.

By the term “remove said exposed regions” during development, we mean that the exposed regions of the outermost layer and the corresponding regions of any underlying layers are selectively, preferentially, and predominantly removed by the developer.

Unless otherwise indicated, percentages refer to percents by dry weight (solids) of with a composition, formulation, or applied layer.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

Unless otherwise indicated, the term "polymer" refers to high and low molecular weight polymers including oligomers and includes homopolymers and copolymers.

The term "copolymer" refers to polymers that are derived from two or more different monomers. That is, they comprise recurring units having at least two different chemical structures.

The term "backbone" refers to the chain of atoms in a polymer to which a plurality of pendant groups can be attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Uses

The imageable elements described herein can be used in a number of ways such as lithographic printing plate precursors as described in more detail below. However, this is not meant to be their only use. For example, the imageable elements can also be used as thermal patterning systems, chemically amplified resists, and microelectronic and microoptical devices, and to form masking elements and printed circuit boards. It is also possible that the unique polymers described herein with Structure (I) pendant groups may be useful in non-imaging applications including paint compositions and molding compositions.

Invention First Polymeric Binders

The first polymeric binders providing the advantages of this invention are soluble in alkaline developers, especially organic solvent-containing developers (defined below). In general, the first polymeric binder comprises a backbone to which are attached pendant groups represented by the following Structure (I):

(I)

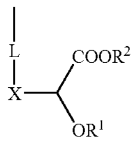

wherein $R^1$ and $R^2$ are independently hydrogen or substituted or unsubstituted alkyl groups having 1 to 8 carbon atoms (such as methyl, ethyl, isopropyl, t-butyl, n-hexyl, isopentyl, methoxyethyl, benzyl, and n-octyl groups) or substituted or unsubstituted aryl groups having 6 or 10 carbon atoms in the carbocyclic ring (such as phenyl, naphthyl, 4-methylphenyl, 3-hydroxyphenyl, and methylnaphthyl groups).

L is a direct bond or a substituted or unsubstituted linking group having at least 1 carbon atom and optionally one or more nitrogen, oxygen, and sulfur atoms in the linking chain.

X is oxy, thio, or —NR— wherein R is hydrogen or a substituted or unsubstituted alkyl group having 1 to 8 carbon atoms (as defined above) or an aryl group having 6 or 10 carbon atoms in the carbocyclic ring (as defined above).

In some embodiments, each of $R^1$ and $R^2$ is hydrogen, L is a direct bond or a linking group that comprises one or more alkylene, arylene, —C(=O)—, —OC(=O)—, —NR(C=O)—, or —S(=O)O— groups, or any combination thereof, wherein R is hydrogen or a substituted or unsubstituted alkyl group having 1 to 4 carbon atoms (as defined above), and X is oxy or —NR—.

In still other embodiments, L is a direct bond or a linking group that comprises one or more substituted or unsubstituted alkylene groups having 1 to 4 carbon atoms (such as methylene, ethylene, tetramethylene, methyletheylene, and 3-methyltetramethylene), —C(=O)—, or —S(=O)O— groups, and X is oxy or —NH—.

In many embodiments, the first polymeric binder can be represented by the following Structure (II):

$$-(A)_x-(B)_y- \quad \text{(II)}$$

wherein A represents recurring units comprising the pendant groups represented by Structure (I), B represents recurring units that do not have pendant groups represented by Structure (I), x is from about 3 to 100 weight % (typically from about 10 to about 70 weight %), and y is 0 to about 97 weight % (typically from about 30 to about 90 weight %).

Particularly useful, B recurring units are those derived from one or more styrenic monomers, vinyl carbazole, (meth)acrylamides, (meth)acrylic acids or esters thereof, (meth)acrylonitriles, vinyl acetate, maleic anhydride, N-substituted phenylmaleimide, vinyl pyridine, vinyl pyrrolidone, and vinyl trimethoxysilane, or any combination thereof. Even more useful B recurring units are those derived from one or more styrenic monomers, N-phenylmaleimide, (meth)acrylonitrile, and (meth)acrylamide.

Examples of useful A recurring units are those derived from one or more of the following ethylenically unsaturated polymerizable monomers (A1) through (A5):

(A1)

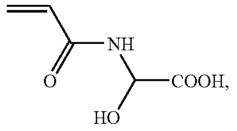

, (A2)

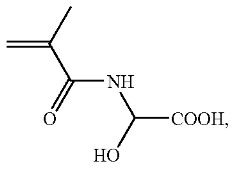

, (A3)

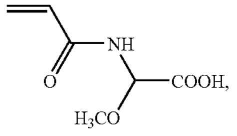

, (A4)

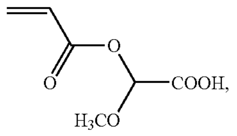

, and

-continued (A5)

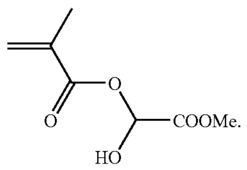

Thus, the method of this invention can be carried out with imageable elements in which the first polymeric binder is represented by the Structure (II) noted above in $R^1$ and $R^2$ are each hydrogen, L is a direct bond or a linking group that comprises one or more substituted or unsubstituted alkylene groups having 1 to 4 carbon atoms, —C(═O)—, or —S(═O)O— groups, and X is oxy or —NH—, B represents recurring derived from one or more styrenic monomers, vinyl carbazole, (meth)acrylamides, (meth)acrylic acids or esters thereof, (meth)acrylonitriles, vinyl acetate, maleic anhydride, N-substituted phenylmaleimide, vinyl pyridine, vinyl pyrrolidone, and vinyl trimethoxysilane, or any combination thereof, x is from about 10 to about 70 weight %, and y is from about 30 to about 90 weight %.

Where the layer containing the first polymeric binder is the only imageable layer, the first polymeric binder is present in an amount of from about 1 to about 30 weight % (typically from about 5 to about 20 weight %) along with the infrared radiation absorbing compound that is present in an amount of from about 0.5 to about 30 weight %.

Where the imageable element includes both inner and outer layers, the inner layer comprises an infrared radiation absorbing compound that is present in an amount of from about 0.5 to about 30 weight % and the first polymeric binder in an amount of from about 50 to about 99.5 weight % (typically from about 75 to about 95 weight %).

The first polymeric binders useful in this invention can be prepared using known starting materials and reaction conditions. Representative synthetic methods for making these polymers are provided below before the Examples. A skilled artisan would be able to use this teaching to prepare other first polymeric binders within the scope of this invention.

Single-Layer Imageable Elements

The single-layer imageable elements include the first polymeric binders as the predominant binders in the single and generally outermost imageable layer.

In general, single-layer imageable elements are formed by suitable application of an imageable layer formulation containing one or more first polymeric binders to a suitable substrate to form an imageable layer. This substrate is usually treated or coated in various ways as described below prior to application of the formulation. The substrate can be treated to provide an "interlayer" for improved adhesion or hydrophilicity, and the single imageable layer is applied over the interlayer.

The substrate generally has a hydrophilic surface, or at least a surface that is more hydrophilic than the applied imageable layer formulation on the imaging side. The substrate comprises a support that can be composed of any material that is conventionally used to prepare imageable elements such as lithographic printing plates. It is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

A useful substrate is composed of an aluminum-containing support that may be coated or treated using techniques known in the art, including physical graining, electrochemical graining, chemical graining, and anodizing. For example, the aluminum sheet can be anodized using phosphonic acid or sulfuric acid using conventional procedures.

An optional interlayer may be formed by treatment of the aluminum support with, for example, a silicate, dextrine, calcium zirconium fluoride, hexafluorosilicic acid, phosphate/fluoride, poly(vinyl phosphonic acid) (PVPA), vinyl phosphonic acid-acrylic acid copolymer, poly(acrylic acid), or (meth)acrylic acid copolymer, or mixtures thereof. For example, the grained and/or anodized aluminum support can be treated with poly(phosphonic acid) using known procedures to improve surface hydrophilicity to provide a lithographic hydrophilic substrate.

The thickness of the substrate can be varied but should be sufficient to sustain the wear from printing and thin enough to wrap around a printing form. Such embodiments typically include a treated aluminum foil having a thickness of from about 100 to about 600 μm.

The backside (non-imaging side) of the substrate may be coated with antistatic agents and/or slipping layers or a matte layer to improve handling and "feel" of the imageable element.

The substrate can also be a cylindrical surface having the radiation-sensitive composition applied thereon, and thus be an integral part of the printing press or a sleeve that is incorporated onto a press cylinder. The use of such imaged cylinders is described for example in U.S. Pat. No. 5,713,287 (Gelbart).

The single imageable layer comprises one or more of the first polymeric binders generally in an amount of from about 1 to about 30 weight % and typically from about 5 to about 20 weight % (based on total dry imageable layer weight). The imageable layer is generally the outermost layer in the single-layer imageable element.

The imageable element also includes one or more infrared radiation absorbing compounds ("IR absorbing compounds") such as infrared radiation absorbing dyes ("IR dyes") that absorb radiation from about 600 to about 1200 nm and typically from about 700 to about 1200 nm.

Examples of suitable IR dyes include but are not limited to, azo dyes, squarylium dyes, triarylamine dyes, thioazolium dyes, indolium dyes, oxonol dyes, oxazolium dyes, cyanine dyes, merocyanine dyes, phthalocyanine dyes, indocyanine dyes, indotricarbocyanine dyes, hemicyanine dyes, streptocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polytiophene dyes, chalcogenopyryloarylidene and bi(chalcogenopyrylo)-polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, polymethine dyes, squaraine dyes, oxazole dyes, croconine dyes, porphyrin dyes, and any substituted or ionic form of the preceding dye classes. Suitable dyes are described for example, in U.S. Pat. No. 4,973,572 (DeBoer), U.S. Pat. No. 5,208,135 (Patel et al.), U.S. Pat. No. 5,244,771 (Jandrue Sr. et al.), and U.S. Pat. No. 5,401,618 (Chapman et al.), and EP 0 823 327A1 (Nagasaka et al.).

Cyanine dyes having an anionic chromophore are also useful. For example, the cyanine dye may have a chromophore having two heterocyclic groups. In another embodiment, the cyanine dye may have at least two sulfonic acid groups, more particularly two sulfonic acid groups and two indolenine groups. Useful IR-sensitive cyanine dyes of this type are described for example in U.S. Patent Application Publication 2005-0130059 (Tao). A general description of one class of suitable cyanine dyes is shown by the formula in paragraph 0026 of WO 2004/101280 (Munnelly et al.).

In addition to low molecular weight IR-absorbing dyes, IR dye moieties bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. No. 6,309,792 (Hauck et al.), U.S. Pat. No. 6,264,920 (Achilefu et al.), U.S. Pat. No. 6,153,356 (Urano et al.), U.S. Pat. No. 5,496,903 (Watanate et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (noted above).

Useful IR absorbing compounds also include various pigments including carbon blacks such as carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful. Other useful pigments include, but are not limited to, Heliogen Green, Nigrosine Base, iron (III) oxides, manganese oxide, Prussian Blue, and Paris Blue. The size of the pigment particles should not be more than the thickness of the imageable layer.

The infrared radiation absorbing compound is generally present in the single-layer imageable element in an amount sufficient to render the imageable layer insoluble to an aqueous developer after exposure to appropriate radiation. This amount is generally at least 0.5% and up to 30 weight % and typically fiom about 3 to about 20 weight % (based on total dry layer weight). The particular amount needed for this purpose would be readily apparent to one skilled in the art, depending upon the specific compound used and the properties of the alkaline developer to be used. In most embodiments, the infrared radiation absorbing compound is present in the single imageable layer. Alternatively or additionally, infrared radiation absorbing compounds may be located in a separate layer that is in thermal contact with the single imageable layer. Thus, during imaging, the action of the infrared radiation absorbing compound can be transferred to the imageable layer without the compound originally being incorporated into it.

In addition, solubility-suppressing components may be incorporated into the imageable layer. Such components act as dissolution inhibitors that function as solubility-suppressing components for the primary polymeric binders. Dissolution inhibitors typically have polar functional groups that are believed to act as acceptor sites for hydrogen bonding with various groups in the polymeric binders. The acceptor sites comprise atoms with high electron density, and can be selected from electronegative first row elements such as carbon, nitrogen, and oxygen. Dissolution inhibitors that are soluble in the alkaline developer are useful. Useful polar groups for dissolution inhibitors include but are not limited to, ether groups, amine groups, azo groups, nitro groups, ferrocenium groups, sulfoxide groups, sulfone groups, diazo groups, diazonium groups, keto groups, sulfonic acid ester groups, phosphate ester groups, triarylmethane groups, onium groups (such as sulfonium, iodonium, and phosphonium groups), groups in which a nitrogen atom is incorporated into a heterocyclic ring, and groups that contain a positively charged atom (such as quaternized ammonium group). Compounds that contain a positively-charged nitrogen atom useful as dissolution inhibitors include, for example, tetralkyl ammonium compounds and quaternized heterocyclic compounds such as quinolinium compounds, benzothiazolium compounds, pyridinium compounds, and imidazolium compounds. Further details and representative compounds useful as dissolution inhibitors are described for example in U.S. Pat. No. 6,294,311 (noted above). Useful dissolution inhibitors include triarylmethane dyes such as ethyl violet, crystal violet, malachite green, brilliant green, Victoria blue B, Victoria blue R, and Victoria pure blue BO, BASONYL® Violet 610 and D11 (PCAS, Longjumeau, France). These compounds can also act as contrast dyes that distinguish the non-imaged areas from the imaged areas in the developed imageable element.

When a dissolution inhibitor is present in the imageable layer, its amount can vary widely, but generally it is present in an amount of at least 0.5 weight % and up to 30 weight %, and typically from about 1 to about 15 weight % (based on the total dry layer weight).

The imageable layer also generally includes one or more additional (or secondary) binder resins other than the first polymeric binders defined above. And such secondary binder resins can be with or without polar groups, or they can comprise a mixture of binder resins, some with polar groups and others without polar groups. Such secondary binder resins generally include phenolic resins such as novolak and resole resins (described below), and such resins can also include one or more pendant diazo, carboxylate ester, phosphate ester, sulfonate ester, sulfinate ester, or ether groups. The hydroxy groups of the phenolic resins can be converted to -T-Z groups in which T represents a polar group and Z represents a non-diazide functional group as described for example in U.S. Pat. No. 6,218,083 (McCullough et al.) and WO 99/001795 (McCullough et al.). The hydroxy groups can also be derivatized with diazo groups containing o-naphthoquinone diazide moieties as described for example in U.S. Pat. No. 5,705,308 (West et al.) and U.S. Pat. No. 5,705,322 (West et al.). Other useful secondary binder resins include acrylate copolymers, cellulose esters, and poly(vinyl acetals) as described for example in U.S. Pat. No. 6,391,524 (Yates et al.) and DE 10 239 505 (Timpe et al.).

Useful additional binder resins include phenolic resins that have a multiplicity of phenolic hydroxyl groups either on the polymer backbone or on pendent groups. Novolak resins, resol resins, acrylic resins that contain pendent phenol groups, and polyvinyl phenol resins are useful phenolic resins.

Novolak resins are commercially available and are well known to those in the art. Novolak resins are typically prepared by the condensation reaction of a phenol, such as phenol, m-cresol, o-cresol, p-cresol, etc, with an aldehyde, such as formaldehyde, paraformaldehyde, acetaldehyde, etc. or ketone, such as acetone, in the presence of an acid catalyst. The weight average molecular weight is typically about 1,000 to 15,000. Typical novolak resins include, for example, phenol-formaldehyde resins, cresol-formaldehyde resins, phenol-cresol-formaldehyde resins, p-t-butylphenol-formaldehyde resins, and pyrogallol-acetone resins. Useful novolak resins are prepared by reacting m-cresol, mixtures of m-cresol and p-cresol, or phenol with formaldehyde using conditions well known to those skilled in the art.

These secondary binder resins may be present in the imageable layer in an amount of from about 10 to about 80 weight % (based on total dry imageable layer weight).

The imageable layer can further include a variety of additives including dispersing agents, humectants, biocides, plasticizers, surfactants for coatability or other properties, viscosity builders, dyes or colorants to allow visualization of the written image, pH adjusters, drying agents, defoamers, preservatives, antioxidants, development aids, rheology modifiers, or combinations thereof, or any other addenda commonly used in the lithographic art, in conventional amounts.

The single-layer imageable element can be prepared by applying the layer formulation(s) over the surface of the substrate (and any other hydrophilic layers provided thereon) using conventional coating or lamination methods. Thus, the formulations can be applied by dispersing or dissolving the desired ingredients in a suitable coating solvent, and the resulting formulations are sequentially or simultaneously applied to the substrate using suitable equipment and procedures, such as spin coating, knife coating, gravure coating, die coating, slot coating, bar coating, wire rod coating, roller coating, or extrusion hopper coating. The formulations can also be applied by spraying onto a suitable support (such as an on-press printing cylinder or printing sleeve).

The coating weight for the single imageable layer can be from about 0.5 to about 2.5 $g/m^2$ and typically from about 1 to about 2 $g/m^2$.

The selection of solvents used to coat the imageable layer formulation depends upon the nature of the polymeric materials and other components in the formulations. Generally, the imageable layer formulation is coated out of acetone, methyl ethyl ketone, or another ketone, tetrahydrofuran, 1-methoxypropan-2-ol, 1-methoxy-2-propyl acetate, and mixtures thereof using conditions and techniques well known in the art. Useful solvent mixtures are described below in TABLE II for Invention Example 2.

Alternatively, the layer(s) may be applied by conventional extrusion coating methods from melt mixtures of the respective layer compositions. Typically, such melt mixtures contain no volatile organic solvents.

Intermediate drying steps may be used between applications of the various layer formulations to remove solvent(s) before coating other formulations. Drying steps may also help in preventing the mixing of the various layers.

Multi-Layer Imageable Elements

In general, the multi-layer imageable elements comprise a substrate, an inner layer (also known in the art as an "underlayer"), and an outer layer (also known in the art as a "top layer" or "topcoat") disposed over the inner layer. Before thermal imaging, the outer layer is generally not soluble or dispersible in a developer within the usual time allotted for development, but after thermal imaging, the exposed regions of the outer layer are soluble or dispersible in the developer, such as a lower pH alkaline developer. The inner layer is also generally removable by the developer. An infrared radiation absorbing compound (described above) is present in such imageable elements, and is typically present only in the inner layer but may optionally be in a separate layer between the inner and outer layers.

The imageable elements are formed by suitable application of an inner layer composition onto a suitable substrate (as described above). This substrate can be an untreated or uncoated support but it is usually treated or coated in various ways as described above prior to application of the inner layer composition. The substrate generally has a hydrophilic surface or at least a surface that is more hydrophilic than the outer layer composition. The substrate comprises a support that can be composed of any material that is conventionally used to prepare imageable elements such as lithographic printing plates.

The inner layer is disposed between the outer layer and the substrate. Typically, it is disposed directly on the substrate (including any hydrophilic coatings as described above). The inner layer comprises a first polymeric binder described above that is removable by the developers described below and typically soluble in the developers to reduce sludging of the developers in the processor. In addition, the first polymeric binder is usually insoluble in the solvent used to coat the outer layer so that the outer layer can be coated over the inner layer without dissolving the inner layer. Mixtures of these first polymeric binders can be used if desired in the inner layer.

The inner layer generally has a dry coating coverage of from about 0.5 to about 2.5 $g/m^2$ and typically from about 1 to about 2 $g/m^2$. The first polymeric binders described above generally comprise at least 50 weight % and typically from about 60 to about 90 weight % based on the total dry layer weight, and this amount can be varied depending upon what other polymers and chemical components are present.

The inner layer may also include one or more additional polymeric binders or resins in combination with the first polymeric binder(s), which materials are generally known in the art for use in the inner layer of multi-layer imageable elements. For example, useful additional polymeric binders for the inner layer include but are not limited to, the polymeric binders described for use in the inner layers of the imageable elements described in U.S. Pat. No. 6,294,311 (Shimazu et al.), U.S. Pat. No. 6,352,812 (Shimazu et al.), U.S. Pat. No. 6,593,055 (Shimazu et al.), U.S. Pat. No. 6,352,811 (Patel et al.), U.S. Pat. No. 6,358,669 (Savariar-Hauck et al.), U.S. Pat. No. 6,528,228 (Savariar-Hauck et al.), U.S. Pat. No. 7,049,045 (Kitson et al.), U.S. Pat. No. 7,186,482 (Kitson et al.), U.S. Pat. No. 7,144,661 (Ray et al.), U.S. Pat. No. 7,247,418 (Saraiya et al.), and U.S. Pat. No. 7,300,726 (Patel et al.), and U.S. Patent Application Publication 2004/0067432 (Kitson et al.), all incorporated herein by reference with respect to those polymeric binders.

Other useful additional polymeric materials can include, for example resole resins and their alkylated analogs, methylol melamine resins and their alkylated analogs (for example melamine-formaldehyde resins), methylol glycoluril resins and alkylated analogs (for example, glycoluril-formaldehyde resins), thiourea-formaldehyde resins, guanamine-formaldehyde resins, and benzoguanamine-formaldehyde resins. Commercially available melamine-formaldehyde resins and glycoluril-formaldehyde resins include, for example, CYMEL® resins (Dyno Cyanamid) and NIKALAC® resins (Sanwa Chemical).

The resin having activated methylol and/or activated alkylated methylol groups is preferably a resole resin or a mixture of resole resins. Resole resins are well known to those skilled in the art. They are prepared by reaction of a phenol with an aldehyde under basic conditions using an excess of phenol. Commercially available resole resins include, for example, GP649D99 resole (Georgia Pacific) and BKS-5928 resole resin (Union Carbide).

Still other useful additional polymeric materials can also include copolymers that comprise from about 25 to about 75 mole % of recurring units derived from N-phenylmaleimide, from about 10 to about 50 mole % of recurring units derived from methacrylamide, and from about 5 to about 30 mole % of recurring units derived from methacrylic acid. These secondary additional copolymers are disclosed in U.S. Pat. Nos. 6,294,311 and 6,528,228 (both noted above).

The additional polymeric materials useful in the inner layer can be prepared by methods, such as free radical polymerization, that are well known to those skilled in the art and that are described, for example, in Chapters 20 and 21, of *Macromolecules*, Vol. 2, 2nd Ed., H. G. Elias, Plenum, New York, 1984. Some of them can be purchased from several commercial sources.

In most embodiments, the inner layer further comprises an infrared radiation absorbing compound ("IR absorbing compounds") that absorbs radiation at from about 600 to about 1200 and typically at from about 700 to about 1200 nm, with minimal absorption at from about 300 to about 600 nm. Examples of useful infiared radiation absorbing compounds are described above. In most embodiments, the infrared radiation absorbing compound is present only in the inner layer. The infrared radiation absorbing compound can be present in the multi-layer imageable element in an amount of generally at least 0.5% and up to 30% and typically from about 3 to about 25%, based on the total dry weight of the element. The particular amount of a given compound to be used could be readily determined by one skilled in the art.

The inner layer can include other components such as surfactants, dispersing aids, humectants, biocides, viscosity builders, drying agents, defoamers, preservatives, antioxidants, and colorants.

The inner layer generally has a dry coating coverage of from about 0.5 to about 2.5 $g/m^2$ and typically from about 1 to about 2 $g/m^2$. The first polymeric binders described above generally comprise at least 50 weight % and typically from about 60 to about 90 weight % based on the total dry layer weight, and this amount can be varied depending upon what other polymers and chemical components are present. Any additional polymeric materials (such as a novolak, resole, or copolymers noted above) can be present in an amount of from about 5 to about 45 weight % based on the total dry weight of the inner layer.

The outer layer of the imageable element is disposed over the inner layer and in most embodiments there are no intermediate layers between the inner and outer layers. The outer layer comprises a second polymeric binder that is different than the first polymeric binder described above. It typically also comprises a dissolution inhibitor or colorant. Alternatively, or additionally, a polymeric material comprising polar groups is present and acts as both the binder and dissolution inhibitor.

Any polymeric binders may be employed in the outer layer of the imageable elements if they have been previously used in outer layers of prior art multi-layer thermally imageable elements. For example, the outer layer polymeric binders can be one or more of those described in U.S. Pat. No. 6,358,669 (Savariar-Hauck), U.S. Pat. No. 6,555,291 (Hauck), U.S. Pat. No. 6,352,812 (Shimazu et al.), U.S. Pat. No. 6,352,811 (Patel et al.), U.S. Pat. No. 6,294,311 (Shimazu et al), U.S. Pat. No. 6,893,783 (Kitson et al.), and U.S. Pat. No. 6,645,689 (Jarek), U.S. Patent Application Publications 2003/0108817 (Patel et al) and 2003/0162126 (Kitson et al), and WO 2005/018934 (Kitson et al).

Generally, the polymer binder in the outer layer is a light-insensitive, water-insoluble, aqueous alkaline developer-soluble, film-forming phenolic resin that has a multiplicity of phenolic hydroxyl groups. Phenolic resins have a multiplicity of phenolic hydroxyl groups, either on the polymer backbone or on pendent groups. Novolak resins, resol resins, acrylic resins that contain pendent phenol groups, and polyvinyl phenol resins are useful phenolic resins.

Novolak resins are commercially available and are well known to those in the art. Novolak resins are typically prepared by the condensation reaction of a phenol, such as phenol, m-cresol, o-cresol, p-cresol, etc, with an aldehyde, such as formaldehyde, paraformaldehyde, acetaldehyde, etc. or ketone, such as acetone, in the presence of an acid catalyst. The weight average molecular weight is typically about 1,000 to 15,000. Typical novolak resins include, for example, phenol-formaldehyde resins, cresol-formaldehyde resins, phenol-cresol-formaldehyde resins, p-t-butylphenol-formaldehyde resins, and pyrogallol-acetone resins. Useful novolak resins are prepared by reacting m-cresol, mixtures of m-cresol and p-cresol, or phenol with formaldehyde using conditions well known to those skilled in the art.

A solvent soluble novolak resin is one that is sufficiently soluble in a coating solvent to produce a coating solution that can be coated to produce an outer layer. In some cases, it may be desirable to use a novolak resin with the highest weight-average molecular weight that maintains its solubility in common coating solvents, such as acetone, tetrahydrofuran, and 1-methoxypropan-2-ol. Outer layers comprising novolak resins, including for example m-cresol only novolak resins (i.e. those that contain at least about 97 mol-% m-cresol) and m-cresol/p-cresol novolak resins that have up to 10 mol-% ofp-cresol, having a weight average molecular weight of at least 10,000 and typically at least 25,000, are useful. Outer layers comprising m-cresol/p-cresol novolak resins with at least 10 mol-% of p-cresol, having a weight average molecular weight of about 8,000 up to about 25,000, may also be used. In some instances, novolak resins prepared by solvent condensation may be desirable. Outer layers comprising these resins are disclosed for example in U.S. Pat. No. 6,858,359 (Kitson, et al.).

Other useful phenolic resins are poly(vinyl phenol) resins that include polymers of one or more hydroxyphenyl containing monomers such as hydroxystyrenes and hydroxyphenyl (meth)acrylates. Other monomers not containing hydroxy groups can be copolymerized with the hydroxy-containing monomers. These resins can be prepared by polymerizing one or more of the monomers in the presence of a radical initiator or a cationic polymerization initiator using known reaction conditions. The weight average molecular weight ($M_w$) of these polymers is from about 1000 to about 200,000, and typically from about 1,500 to about 50,000 g/mol.

Examples of useful hydroxy-containing polymers include ALNOVOL SPN452, SPN400, HPN100 (Clariant GmbH), DURITE PD443, SD423A, SD126A (Borden Chemical, Inc.), BAKELITE 6866LB02, AG, 6866LB03 (Bakelite AG), KR 400/8 (Koyo Chemicals Inc.), HRJ 1085 and 2606 (Schenectady International, Inc.), and Lyncur CMM (Siber Hegner), all of which are described in U.S. Patent Application Publication 2005/0037280 (noted above).

The outer layer can also include non-phenolic polymeric materials as film-forming binder materials in addition to or instead of the phenolic resins described above. Such non-phenolic polymeric materials include polymers formed from maleic anhydride and one or more styrenic monomers (that is styrene and styrene derivatives having various substituents on the benzene ring), polymers formed from methyl methacrylate and one or more carboxy-containing monomers, and mixtures thereof. These polymers can comprise recurring units derived from the noted monomers as well as recurring units derived from additional, but optional monomers [such as (meth)acrylates, (meth)acrylonitrile and (meth)acrylamides]. Other hydroxy-containing polymeric binders also include heat-labile moieties as described for example in U.S. Pat. No. 7,163,777 (Ray et al.).

The polymers derived from maleic anhydride generally comprise from about 1 to about 50 mol % of recurring units derived from maleic anhydride and the remainder of the recurring units derived from the styrenic monomers and optionally additional polymerizable monomers.

The polymer formed from methyl methacrylate and carboxy-containing monomers generally comprise from about 80 to about 98 mol % of recurring units derived from methyl methacrylate. The carboxy-containing recurring units can be derived, for example, from acrylic acid, methacrylic acid, itaconic acid, maleic acid, and similar monomers known in the art. Carboxy-containing polymers are described for example in U.S. Pat. No. 7,169,518 (Savariar-Hauck et al.).

The outer layer can also comprise one or more polymer binders having pendant epoxy groups sufficient to provide an epoxy equivalent weight of from about 130 to about 1000 (preferably from about 140 to about 750) as described for example in U.S. Pat. No. 7,160,653 (Huang et al.). Any film-forming polymer containing the requisite pendant epoxy groups can be used including condensation polymers, acrylic resins, and urethane resins. The pendant epoxy groups can be part of the polymerizable monomers or reactive components used to make the polymers, or they can be added after polymerization using known procedures. The outer layer can comprise one or more acrylic resins that are derived from one or more ethylenically unsaturated polymerizable monomers, at least one of which monomers comprises pendant epoxy groups.

Useful polymers of this type have pendant epoxy groups attached to the polymer backbone through a carboxylic acid ester group such as a substituted or unsubstituted —C(═O)O-alkylene, —C(═O)O-alkylene-phenylene-, or —C(═O)O-phenylene group wherein alkylene has 1 to 4 carbon atoms. Ethylenically unsaturated polymerizable monomers having pendant epoxy groups useful to make these polymer binders include glycidyl acrylate, glycidyl methacrylate, 3,4-epoxycyclohexyl methacrylate, and 3,4-epoxycyclohexyl acrylate.

The epoxy-containing polymers can also comprise recurring units derived from one or more ethylenically unsaturated polymerizable monomers that do not have pendant epoxy groups including but not limited to, (meth)acrylates, (meth) acrylamides, vinyl ether, vinyl esters, vinyl ketones, olefins, unsaturated imides (such as maleimide), N-vinyl pyrrolidones, N-vinyl carbazole, vinyl pyridines, (meth)acrylonitriles, and styrenic monomers. For example, a styrenic monomer could be used in combination with methacrylamide, acrylonitrile, maleimide, vinyl acetate, or N-vinyl pyrrolidone.

Still other useful polymeric binders for the outer layer include those having a polymer backbone and pendant sulfonamide groups such as pendant —X—C(═T)-NR—$S(=O)_2$— groups that are attached to the polymer backbone, wherein X is oxy or amido, T is oxygen or sulfur, and R is hydrogen, halo, or an alkyl group having 1 to 6 carbon atoms, as described in U.S. Pat. No. 7,163,770 (Saraiya et al.).

The polymeric binders in the outer layer can also be branched hydroxystyrene polymers that include recurring units derived from 4-hydroxystyrene, which recurring units are further substituted with repeating 4-hydroxystyrene units positioned ortho to the hydroxy groups.

The one or more polymer binders are present in the outer layer in an amount of at least 60 weight %, and typically from about 65 to about 99.5 weight %.

The outer layer generally and optionally comprises a dissolution inhibitor that functions as a solubility-suppressing component for the binder. Dissolution inhibitors generally have polar functional groups that are thought to act as acceptor sites for hydrogen bonding, such as with hydroxyl groups of the binder. Dissolution inhibitors that are soluble in the developer are most suitable. Alternatively, or additionally, the polymer binder may contain solubility-suppressing polar groups that function as the dissolution inhibitor. Useful dissolution inhibitor compounds are described for example in U.S. Pat. No. 5,705,308 (West, et al.), U.S. Pat. No. 6,060,222 (West et al.), and U.S. Pat. No. 6,130,026 (Bennett, et al.).

Compounds that contain a positively charged (that is, quaternized) nitrogen atom useful as dissolution inhibitors include, for example, tetraalkyl ammonium compounds, quinolinium compounds, benzothiazolium compounds, pyridinium compounds, and imidazolium compounds. Representative tetraalkyl ammonium dissolution inhibitor compounds include tetrapropyl ammonium bromide, tetraethyl ammonium bromide, tetrapropyl ammonium chloride, and trimethylalkyl ammonium chlorides and trimethylalkyl ammonium bromides, such as trimethyloctyl ammonium bromide and trimethyldecyl ammonium chloride. Representative quinolinium dissolution inhibitor compounds include 1-ethyl-2-methyl quinolinium iodide, 1-ethyl-4-methyl quinolinium iodide and cyanine dyes that comprise a quinolinium moiety such as Quinoldine Blue. Representative benzothiazolium compounds include 3-ethyl-2(3H)-benzothiazolylidene)-2-methyl-1-(propenyl)benzothiazolium cationic dyes and 3-ethyl-2-methyl benzothiazolium iodide.

Diazonium salts are useful as dissolution inhibitor compounds and include, for example, substituted and unsubstituted diphenylamine diazonium salts, such as methoxy-substituted diphenylamine diazonium hexafluoroborates. Representative sulfonic acid esters useful as dissolution inhibitor compounds include ethyl benzene sulfonate, n-hexyl benzene sulfonate, ethyl p-toluene sulfonate, t-butyl p-toluene sulfonate, and phenyl p-toluene sulfonate. Representative phosphate esters include trimethyl phosphate, triethyl phosphate, and tricresyl phosphate. Useful sulfones include those with aromatic groups, such as diphenyl sulfone. Useful amines include those with aromatic groups, such as diphenylamine and triphenylamine.

Keto-containing compounds useful as dissolution inhibitor compounds include, for example, aldehydes, ketones, especially aromatic ketones, and carboxylic acid esters. Representative aromatic ketones include xanthone, flavanones, flavones, 2,3-diphenyl-1-indenone, 1'-(2'-acetonaphthonyl) benzoate, 2,6-diphenyl-4H-pyran-4-one and 2,6-diphenyl-4H-thiopyran-4-one. Representative carboxylic acid esters include ethyl benzoate, n-heptyl benzoate, and phenyl benzoate.

Other readily available dissolution inhibitors are triarylmethane dyes, such as ethyl violet, crystal violet, malachite green, brilliant green, Victoria blue B, Victoria blue R, Victoria blue BO, BASONYL Violet 610. These compounds can also act as contrast dyes that distinguish the non-exposed regions from the exposed regions in the developed imageable element.

When a dissolution inhibitor compound is present in the outer layer, it typically comprises at least about 0.1 weight %, more generally from about 0.5 to about 30 weight %, or from about 1 to about 15 weight %, based on the dry weight of the outer layer.

Alternatively, or additionally, the polymer binder in the outer layer can comprise polar groups that act as acceptor sites for hydrogen bonding with the hydroxy groups present in the polymeric material and, thus, act as both the binder and dissolution inhibitor. These derivatized polymeric materials can be used alone in the outer layer, or they can be combined with other polymeric materials and/or solubility-suppressing components. The level of derivatization should be high enough that the polymeric material acts as a dissolution inhibitor, but not so high that, following thermal imaging, the polymeric material is not soluble in the developer. Although the degree of derivatization required will depend on the nature of the polymeric material and the nature of the moiety containing the polar groups introduced into the polymeric material, typically from about 0.5 mol % to about 5 mol % of the hydroxyl groups will be derivatized.

One group of polymeric materials that comprise polar groups and function as dissolution inhibitors are derivatized phenolic polymeric materials in which a portion of the phenolic hydroxyl groups have been converted to sulfonic acid esters, preferably phenyl sulfonates or p-toluene sulfonates. Derivatization can be carried out by reaction of the polymeric material with, for example, a sulfonyl chloride such as p-toluene sulfonyl chloride in the presence of a base such as a tertiary amine. A useful material is a novolak resin in which from about 1 to about 3 mol % of the hydroxyl groups has been converted to phenyl sulfonate or p-toluene sulfonate (tosyl) groups.

Another group of polymeric materials that comprise polar groups and function as dissolution inhibitors are derivatized phenolic resins that contain the diazonaphthoquinone moiety. Polymeric diazonaphthoquinone compounds include derivatized resins formed by the reaction of a reactive derivative that contains diazonaphthoquinone moiety and a polymeric material that contains a suitable reactive group, such as a hydroxyl or amino group. Derivatization of phenolic resins with compounds that contain the diazonaphthoquinone moiety is known in the art and is described, for example, in U.S. Pat. Nos. 5,705,308 and 5,705,322 (both West, et al.). An example of a resin derivatized with a compound that comprises a diazonaphthoquinone moiety is P-3000 (available from PCAS, France) that is a naphthoquinone diazide of a pyrogallol/acetone resin.

To reduce ablation during imaging with infrared radiation, the outer layer is generally substantially free of radiation absorbing compounds, meaning that none of those compounds are purposely incorporated therein and insubstantial amounts diffuse into it from other layers. Thus, any radiation absorbing compounds in the outer layer absorb less than about 10% of the imaging radiation, typically less than about 3% of the imaging radiation, and the amount of imaging radiation absorbed by the outer layer, if any, is not enough to cause ablation of the outer layer.

The outer layer can also include other components such as coating surfactants, dispersing aids, humectants, biocides, viscosity builders, drying agents, antifoaming agents, preservatives, antioxidants, colorants, and contrast dyes.

The outer layer generally has a dry coating coverage of from about 0.2 to about 2 g/m$^2$ and typically from about 0.4 to about 1 g/m$^2$.

There may be a separate layer that is disposed between the inner and outer layers. This separate layer (or interlayer) can act as a barrier to minimize migration of radiation absorbing compounds from the inner layer to the outer layer. This interlayer generally comprises a polymeric material that is soluble in an alkaline developer. A useful polymeric material of this type is a poly(vinyl alcohol).

Alternatively, there may be a separate layer between the inner and outer layers than contains the infrared radiation absorbing compound(s), which may also be present in the inner layer, or solely in the separate layer. However, in some embodiments, the infrared absorbing compound may be in the outer layer only, or in both the outer and inner layers, as described for example in EP 1,439,058A2 (Watanabe et al.) and EP 1,738,901A1 (Lingier et al.).

Preparation of Multi-Layer Imageable Elements

The multi-layer imageable element can be prepared by sequentially applying an inner layer formulation over the surface of the hydrophilic substrate (and any other hydrophilic layers provided thereon), and then applying an outer layer formulation over the inner layer using conventional coating or lamination methods. It is important to avoid intermixing of the inner and outer layer formulations.

For example, a multi-layer imageable element can be prepared with an inner layer comprising a first polymeric binder (as described above) and a radiation absorbing compound, and an ink receptive outer layer comprising a second polymeric binder that: (1) is different than the first polymeric binder, and (2) is soluble or dispersible in an alkaline developer upon exposure to imaging radiation.

The inner and outer layers can be applied by dispersing or dissolving the desired ingredients in a suitable coating solvent, and the resulting formulations are sequentially or simultaneously applied to the substrate using suitable equipment and procedures, such as spin coating, knife coating, gravure coating, die coating, slot coating, bar coating, wire rod coating, roller coating, or extrusion hopper coating. The formulations can also be applied by spraying onto a suitable support (such as an on-press printing cylinder).

The selection of solvents used to coat both the inner and outer layers depends upon the nature of the first and second polymeric binders, other polymeric materials, and other components in the formulations. To prevent the inner and outer layer formulations from mixing or the inner layer from dissolving when the outer layer formulation is applied, the outer layer formulation should be coated from a solvent in which the first polymeric binder(s) of the inner layer are insoluble.

Generally, the inner layer formulation is coated out of a solvent mixture of methyl ethyl ketone (MEK), 1-methoxy-2-propyl acetate (PMA), γ-butyrolactone (BLO), and water, a mixture of MEK, BLO, water, and 1-methoxypropan-2-ol (also known as Dowanol® PM or PGME), a mixture of diethyl ketone (DEK), water, methyl lactate, and BLO, a mixture of DEK, water, and methyl lactate, or a mixture of methyl lactate, methanol, and dioxolane. A suitable solvent mixture is described in Invention Example 1 below.

The outer layer formulation can be coated out of solvents or solvent mixtures that do not dissolve the inner layer. Typical solvents for this purpose include but are not limited to, acetone, butyl acetate, iso-butyl acetate, methyl iso-butyl ketone, DEK, 1-methoxy-2-propyl acetate (PMA), iso-propyl alcohol, PGME and mixtures thereof Particularly useful is a mixture of DEK and PMA, a mixture of DEK and acetone, or a mixture of DEK, PMA, and isopropyl alcohol.

Alternatively, the inner and outer layers may be applied by extrusion coating methods from melt mixtures of the respective layer compositions. Typically, such melt mixtures contain no volatile organic solvents.

Intermediate drying steps may be used between applications of the various layer formulations to remove solvent(s) before coating other formulations. Drying steps may also help in preventing the mixing of the various layers.

After drying the layers, the element can be further "conditioned" with a heat treatment at from about 40 to about 90° C. for at least 4 hours (for example, at least 20 hours) under conditions that inhibit the removal of moisture from the dried layers. For example, the heat treatment is carried out at from about 50 to about 70° C. for at least 24 hours. During the heat treatment, the imageable element is wrapped or encased in a water-impermeable sheet material to represent an effective barrier to moisture removal from the precursor, or the heat treatment of the imageable element is carried out in an environment in which relative humidity is controlled to at least 25%. In addition, the water-impermeable sheet material can be sealed around the edges of the imageable element, with the water-impermeable sheet material being a polymeric film or metal foil that is sealed around the edges of the imageable element.

In some embodiments, this heat treatment can be carried out with a stack comprising at least 100 of the same imageable elements, or when the imageable element is in the form of a coil or web.

Imaging and Development

The single- and multi-layer imageable elements can have any useful form including, but not limited to, printing plate precursors, printing cylinders, printing sleeves (solid or hollow cores) and printing tapes (including flexible printing webs). For example, the imageable members can be lithographic printing plate precursors useful for providing lithographic printing plates having hydrophilic substrate surfaces.

Printing plate precursors can be of any size or shape (for example, square or rectangular) having the requisite one or more imageable layers disposed on a suitable substrate. Printing cylinders and sleeves are known as rotary printing members having a substrate and at least one imageable layer in cylindrical form. Hollow or solid metal cores can be used as substrates for printing sleeves.

During use, the single- and multi-layer imageable elements are exposed to a suitable source of radiation such as infrared radiation, depending upon the infrared radiation absorbing compound present in the element, for example at a wavelength of from about 600 to about 1500 nm and typically from about 700 to about 1200 nm. The lasers used to expose the imageable elements are usually diode lasers, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of from about 800 to about 850 nm or from about 1040 to about 1120 nm.

The imaging apparatus can function solely as a platesetter or it can be incorporated directly into a lithographic printing press. In the latter case, printing may commence immediately after imaging thereby reducing press set-up time considerably. The imaging apparatus can be configured as a flatbed recorder or as a drum recorder, with the imageable member mounted to the interior or exterior cylindrical surface of the drum. Examples of useful imaging apparatus are available as models of Kodak Trendsetter® imagesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging speeds may be in the range of from about 50 to about 1500 $mJ/cm^2$, and typically from about 75 to about 400 $mJ/cm^2$.

While laser imaging is useful in the practice of this invention, imaging can be provided by any other means that provides thermal energy in an imagewise fashion. For example, imaging can be accomplished using a thermoresistive head (thermal printing head) in what is known as "thermal printing", as described for example in U.S. Pat. No. 5,488,025 (Martin et al.) and as used in thermal fax machines and sublimation printers. Thermal print heads are commercially available (for example, as a Fujitsu Thermal Head FTP-040 MCS001 and TDK Thermal Head F415 HH7-1089).

Direct digital imaging is generally used for imaging. The image signals are stored as a bitmap data file on a computer. Raster image processor (RIP) or other suitable means may be used to generate such files. The bitmaps are constructed to define the hue of the color as well as screen frequencies and angles.

Imaging of the imageable element produces an imaged element that comprises a latent image of imaged (exposed) and non-imaged (non-exposed) regions. Developing the imaged element with a suitable developer removes predominantly only the exposed regions of the outer layer and the underlying portions of underlayers (including the inner layer), and reveals the hydrophilic surface of the substrate. Thus, the imageable elements are "positive-working" (for example, positive-working lithographic printing plate precursors). The revealed regions of the hydrophilic surface repel ink while the non-exposed regions of the outer layer accept ink.

Development is carried out for a time sufficient to remove the imaged (exposed) regions of the imaged element, but not long enough to remove the non-exposed regions. Because of the nature of the primary polymeric binder(s) used in the imageable layer, removal of the exposed regions readily occurs during development but the removed portions of the imageable layer are readily soluble in the developer, thereby reducing sludge or residue in the developer.

The imaged elements are generally developed using conventional processing conditions using a suitable alkaline developers described below. Some developers generally have a pH of 13 or less and typically from about 7 to about 13, or from about 7 to about 12.5. In some embodiments, development is carried out using a lower pH developer that has a pH of from about 7 to about 12 and comprises benzyl alcohol, 2-phenoxyethanol, or both.

Some useful developers are generally single-phase solutions of water and one or more organic solvents that are miscible with water. Useful organic solvents can contain the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, or ethers of ethylene glycol, diethylene glycol, and of propylene glycol with alkyl groups having 6 or less carbon atoms, such as 2-ethylethanol and 2-butoxyethanol. The organic solvent(s) is generally present in an amount of from about 0.5 to about 15% based on total developer weight.

Representative developers useful in this invention include but are not limited to, ND-1 Developer, 955 Developer, 956 Developer, 989 Developer, and 980 Developer (all available from Eastman Kodak Company), HDN-1 Developer (available from Fuji), and EN 232 Developer (available from Agfa). These developers can be used to advantage in the methods of this invention in combination with unique first polymeric binder in an imageable layer to provide desired advantages.

Other useful alkaline developers may have somewhat higher pH than the organic solvent-containing developers, for example, a pH of from about 8 to about 14 and more typically of from about 12 to about 14. Useful alkaline aqueous developers include 3000 Developer, 9000 Developer, GoldStar® Developer, Goldstar® Plus Developer, GoldStar® Premium, GREENSTAR Developer, ThermalPro Developer, PROTHERM Developer, MX1813 Developer, and MX1710 Developer (all available from Eastman Kodak Company), as well as Fuji HDP7 Developer (Fuji Photo) and Energy CTP Developer (Agfa). These compositions generally include surfactants, chelating agents (such as salts of ethylenediaminetetraacetic acid), and alkaline components (such as inorganic metasilicates, organic metasilicates, hydroxides, and bicarbonates).

Such highly alaine developers can also include one or more "coating-attack suppressing agents" that are developer-soluble compounds that suppress developer attack of the outer layer. "Developer-soluble" means that enough of the agent(s) will dissolve in the developer to suppress attack by the developer. Mixtures of these compounds can be used. Typically, the coating-attack suppressing agents are developer-soluble polyethoxylated, polypropoxylated, or polybutoxylated compounds that include recurring —($CH_2$—$CHR_a$—O—)— units in which $R_a$ is hydrogen or a methyl or ethyl group. Each agent can have the same or different recurring units (in a random or block fashion). Representative compounds of this type include but are not limited to, polyglycols and polycondensation products having the noted recurring units. Examples of such compounds and representative sources, tradenames, or methods of preparing are described for example in U.S. Pat. No. 6,649,324 (Fiebag et al.) that is incorporated herein by reference.

Generally, the developer is applied to the imaged element by rubbing or wiping the outer layer with an applicator containing the developer. Alternatively, the imaged element can be brushed with the developer or the developer may be applied by spraying the outer layer with sufficient force to remove the exposed regions. The imaged element can be immersed in the developer. In all instances, a developed image is produced, particularly in a lithographic printing plate.

Following development, the imaged element can be rinsed with water and dried in a suitable fashion. The dried element can also be treated with a conventional gumming solution preferably gum arabic).

The imaged and developed element can also be baked in a postbake operation that can be carried out to increase run length of the resulting imaged element. Baking can be carried out, for example at from about 160° C. to about 240° C. for from about 2 to about 10 minutes. In some embodiments, the imaged and developed element is baked at a temperature of from about 150 to about 250° C. for from about 1 to about 10 minutes.

A lithographic ink and fountain solution can be applied to the printing surface of the imaged element for printing. The non-exposed regions of the outermost layer take up ink and the hydrophilic surface of the substrate revealed by the imaging and development process takes up the fountain solution. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means and chemicals.

The following examples are provided to illustrate the practice of the invention but are by no means intended to limit the invention in any manner.

EXAMPLES

The components and materials used in the examples and analytical methods were as follows. Unless otherwise indicated, the components can be obtained from various commercial sources such as Aldrich Chemical Co. (Milwaukee, Wis.).

Basonyl Violet is Basic Violet 3 ($\lambda_{max}$ at 588 nm).

BC represents 2-butoxyethanol (available as Butyl Cellosolve®).

BOH-M is the compound having the following formula:

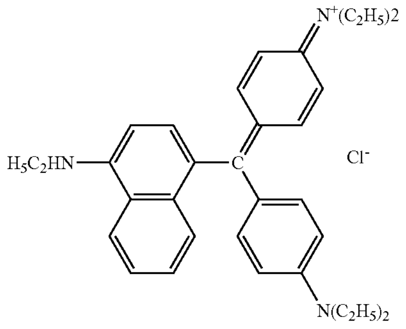

BOH-M

BLO is γ-butyrolactone.

Byk® 307 is a polyethoxylated dimethylpolysiloxane copolymer that is available from Byk Chemie (Wallingford, Conn.) in a 25 wt. % xylene/-methoxypropyl acetate solution.

D11 represents a triarylmethane dye (CAS 433334-91).

DAA represents diacetone alcohol.

DEK represents diethyl ketone.

Durez 33816 is a cresylic novolac resin that is available from Durez-Sumitomo (Grand Island, N.Y.).

Ethyl violet is assigned C.I. 42600 (CAS 2390-59-2, $\lambda_{max}$=596 nm) and has a formula of p-$(CH_3CH_2)_2NC_6H_4)_3C^+$ $Cl^-$.

Goldstar® Plus Developer is a metasilicates-containing developer that is available from Eastman Kodak Company (Rochester, N.Y.).

IR Dye A is represented by the following formula and can be obtained from Eastman Kodak Company (Rochester, N.Y.):

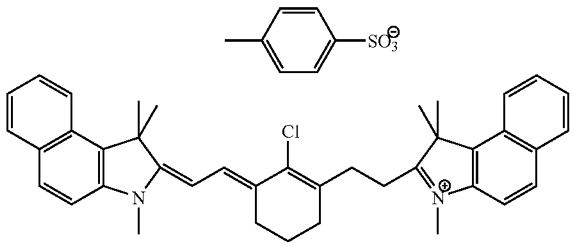

IR Dye A

IR Dye B is a 2-[2-[2-chloro-3-[(1,3-dihydro-1,3,3-trimethyl-2H-indol-2-ylidene)ethylidene]-1-cyclohexen-1-yl] ethenyl]-1,3,3-trimethyl-3H-indolium bromide that was obtained from Honeywell Specialty Chemicals (Morristown, N.J.).

LB6564 is a phenol/cresol novolak resin that was obtained from Rutgers-Lenco LLC (Sheboygan, Wis.).

MEK represents methyl ethyl ketone.

P3000 represents a pyrogallol-acetone novolak that was derivatized with naphthoquinonediazide and was obtained from PCAS (France).

Paintad 19 (or Dow Corning 19) is available from Dow Corning Company (Corning, N.Y.).

PD-140 (sometimes known as PD 140A) represents a novolak resin that was obtained from Borden Chemical Company (Columbus, Ohio).

PD494 is a novolak resin condensed from m-/p-cresol with formaldehyde and available from Borden Chemical Company.

Pelex NBL surfactant was obtained from Kao Corporation (Japan).

PGME represents 1-methoxypropan-2-ol (or Dowanol® PM).

RX-04 represents a copolymer derived from styrene and maleic anhydride that was obtained from Gifu (Japan).

Silikophen P50X is a phenylmethyl polysiloxane that was obtained from Tego Chemie Service (Essen, Germany).

SMA resin is a copolymer derived from styrene and maleic anhydride (molar ratio 1:1).

Substrate A is a 0.3 mm gauge aluminum sheet that had been electrograined, anodized, and subjected to treatment poly(vinyl phosphonic acid).

XDSA represents 4,6-dimethyl-N,N'-diphenyl-1,3-benzenedisulfonamide.

956 Developer is available from Eastman Kodak Company.

SYNTHETIC EXAMPLES

Synthesis of Polymer A:

2,2'-Azobis(isobutyronitrile) (AIBN, 0.5 g), N-phenylmaleimide (PMI, 6 g)), acrylonitrile (18 g), methacrylamide (3 g), 2-acrylamidoglycolic acid (13 g), and N,N-dimethylacetamide (DMAC, 160 g) were placed in a 250-ml 3-necked flask, equipped with magnetic stirring, condenser, temperature controller and $N_2$ inlet. The mixture was heated to 70° C. and stirred under $N_2$ protection for 6 hours. AIBN (0.2 g) was added and the reaction mixture was stirred for another 20 hours. The polymer conversion was ~95% based on determination of percent of non-volatiles. After cooling to room temperature, the reaction solution was slowly dropped into iced water (4000 ml) and a precipitate was formed. After filtration and drying at below 50° C., 28 g of powder solid was obtained.

Synthesis of Polymer B:

2,2'-Azobis(isobutyronitrile) (AIBN, 0.5 g), N-phenylmaleimide (PMI, 5 g)), acrylonitrile (18 g), methacrylamide (2 g), 2-acrylamidoglycolic acid (15 g), and N,N-dimethylacetamide (DMAC, 160 g) were placed in a 250-ml 3-necked flask, equipped with magnetic stirring, condenser, temperature controller and $N_2$ inlet. The mixture was heated to 70° C. and stirred under $N_2$ protection for 6 hours. AIBN (0.2 g) was added and the reaction mixture was stirred for another 20 hours. The polymer conversion was ~95% based on determination of percent of non-volatiles. After cooling to room temperature, the reaction solution was slowly dropped into ice water (4000 ml) and a precipitate was formed. After filtration and drying at below 50° C., 30 g of powder solid was obtained.

Synthesis of Polymer C:

2,2'-Azobis(isobutyronitrile) (AIBN, 0.25 g), N-phenylmaleimide (PMI, 10 g)), methacrylamide (4 g), 2-acrylamidoglycolic acid (6 g), and N,N-dimethylacetamide (DMAC, 80 g) were placed in a 250-ml 3-necked flask, equipped with magnetic stirring, condenser, temperature controller and $N_2$ inlet. The mixture was heated to 75° C. and stirred under $N_2$ protection for 2 hours. AIBN (0.1 g) was added and the reaction mixture was stirred for another 20 hours. The polymer conversion was >98% based on determination of percent of non-volatiles. After cooling to room temperature, the reaction solution was slowly dropped into ice water (3000 ml) and a precipitate was formed. After filtration and drying at below 50° C., 18.0 g of powder solid was obtained.

Synthesis of Polymer D:

2,2'-Azobis(isobutyronitrile) (AIBN, 0.25 g), N-phenylnaleimide (PMI, 10 g)), methacrylamide (5 g), 2-acrylamidoglycolic acid (5 g), and N,N-dimethylacetanide (DMAC, 80 g) were placed in a 250-ml 3-necked flask, equipped with magnetic stirring, condenser, temperature controller and $N_2$ inlet. The mixture was heated to 75° C. and stirred under $N_2$ protection for 2 hours. AIBN (0.1 g) was added and the reaction mixture was stirred for another 20 hours. The polymer conversion was >98% based on determination of percent of non-volatiles. After cooling to room temperature, the reaction solution was slowly dropped into ice water (3000 ml) and a precipitate was formed. After filtration and drying at below 50° C., 18.2 g of powder solid was obtained.

Synthesis of N-(4-Carboxyphenyl)methacrylamide (N-BAMAAm):

Acetonitrile (300 ml), methacrylic acid (47.6 g), and ethyl chloro formate (60.05 g) were added in 2-liter 4-neck ground glass flask, equipped with a heating mantle, temperature controller, mechanical glass stirrer, condenser, pressure equalized addition funnel and nitrogen inlet. Triethylamine (55.8 g) was then added slowly at room temperature over one hour while maintaining the reaction temperature maximum at 40° C. The reaction mixture was then stirred for an additional one hour at room temperature. Triethylamine hydrochloride salt (TEA:HCl) was removed and theoretical amount of TEA:HCl salt was obtained. The mother liquor was placed back into the flask and 4-amino benzoic acid (68.55 g) was added. The reaction mixture was then heated to 50° C. and kept there for 3 hours. The mixture was precipitated in 2.5 liters of 0.1N HCl solution and washed with 1.25 liters of water. The powder was collected by filtration and dried in vacuum oven below 40° C. overnight.

Synthesis of Polymer E:

Dimethylacetamide (65 g), N-BAMAAm (6.5 g), acrylonitrile (8.4 g), methacrylamide (1.7 g), N-phenyl maleimide (0.9 g), and Vazo-64 (0.175 g) were added to a 500 ml 4-neck ground glass flask, equipped with a heating mantle, temperature controller, mechanical stirrer, condenser, pressure equalized addition funnel and nitrogen inlet. The reaction mixture was heated to 80° C. under a nitrogen atmosphere. Then a pre-mixture of dimethylacetamide (100 g), N-BAMAAm (19.4 g), acrylonitrile (25.2 g), methacrylamide (5.3 g), N-phenyl maleimide (2.6 g), and Vazo-64 (0.35 g) were added over two hours at 80° C. The reaction was continued another eight hours and Vazo 64 (0.35 g) was added two more times. The polymer conversion was >99% based on a determination of percent of non-volatiles. The weight ratio of the resulting N-BAMAAm/-AN/methacrylamide/N-phenyl maleimide polymer was 37:48:10:5. The viscosity (G.H'33) was G+(~170 cps) at 30% non-volatiles in DMAC.

The resin solution was precipitated in powder form using ethanol/water (60:40) using Lab Dispersator (4000 RPM) and filtered, and the slurry was re-dissolved in ethanol and filtered. The resulting powder was dried at room temperature for 48 hours. The resulting yield was 85% and the polymer acid number was 94.4 (actual) versus 95 (theoretical).

Synthesis of Polymer F:

Methyl cellosolve (199.8 g), N-methoxymethyl methacrylamide (18 g), benzyl methacrylate (11.4 g), methacrylic acid (3 g), dodecyl mercaptan (0.075 g), and Vazo-64 (0.6 g) were added to 500 ml 4-neck ground glass flask, equipped with a heating mantle, temperature controller, mechanical stirrer, condenser, pressure equalized addition funnel and nitrogen inlet. The reaction mixture was heated to 80° C. under nitrogen atmosphere. Then, a pre-mixture of N-methoxymethyl methacrylamide (55 g), benzyl methacrylate (34 g), methacrylic acid (9 g), dodecyl mercaptan (0.225 g), and Vazo-64 (1.2 g) were added over two hours at 80° C. The reaction was continued another eight hours and Vazo 64 (0.35 g) was added two more times. The polymer conversion was >99% based on determination of percent of non-volatiles. The weight ratio of N-methoxymethyl methacrylamide/benzyl methacrylate/methacrylic acid in the polymer was 56/34.8/9.2. The resin solution was precipitated in powder form using DI water/Ice (3:1) and a Lab Dispersator (4000 RPM) and then filtered. The resulting powder was dried at room temperature for 24 hours. The next day, a tray containing the polymer was placed in oven at 110° F. (43° C.) for two additional days. The yield was 95% and polymer acid number was 58 (actual) versus 58.8 (theoretical).

Substrate B:

An aluminum sheet of thickness 0.24 mm was degreased with sodium hydroxide and electrolytically grained in 20% hydrochloric acid bath. A topography of average roughness of 0.5 μm was obtained. The aluminum sheet was then anodized at 2 $A/dm^2$ of current density in a 20% sulfuric acid bath and 2.7 $g/m^2$ of aluminum oxide layer was formed. After washing and drying, the aluminum substrate was dipped in a 0.5 wt.% aqueous solution of poly(vinyl phosphonic acid) for 10 seconds at 60° C., washed, and dried.

Synthesis of Acrylic Resin 1:

N,N'-Dimethylacetamide (58.8 g) was added to a 200 ml flask with a stirrer, a water-cooled condenser and a dropping funnel and N,N-dimethylacetamide was heated to 90° C. Under a nitrogen atmosphere, a mixture of 8.23 g of N-phenylmaleimide (PMI), 6.68 g of methacrylamide (MAAm), 27.3 g of acrylamidoglycolic acid-monohydrate (AAGA, purity 96%), 19.44 g of acrylonitrile (AN), 4.44 g of styrene (St), 0.63 g of azobis(isobutyronitrile) (AIBN), and 53.4 g of N,N'-dimethylacetamide was continuously dropped into the flask over 2 hours. Then, 5.3 g of AIBN were added into the reaction mixture and it was heated to 100° C. and kept for 6 hours under stirring. During the reaction, 0.3 g of AIBN was added at intervals of 1 hour. After the Gardner viscosity value of the reaction mixture showed X-Y at 25° C., the reaction mixture was cooled down to 60° C. and poured into 1.5 liters of water. The resulting precipitate was filtered, washed again with 1.5 liters of water, and dried at 60° C. for 24 hours under vacuum. About 58.7 g of Acrylic Resin 1 (Mw=40,000) was obtained (Yield 95%).

Synthesis of Acrylic Resins 2-6:

Acrylic Resins 2-6 were derived from the materials listed below in TABLE I using the same procedure used to obtain Acrylic Resin 1.

TABLE I

| | PMI | MAAm | AAGA | AN | St | Phosmer M | 4-Methyl-St | Methyl Methacrylate |
|---|---|---|---|---|---|---|---|---|
| Acrylic Resin 1 | 13.3 | 10.8 | 37.5 | 31.3 | 7.1 | 0 | 0 | 0 |
| Acrylic Resin 2 | 13.3 | 10.8 | 37.5 | 31.3 | 0 | 0 | 0 | 7.1 |
| Acrylic Resin 3 | 10.0 | 7.5 | 37.5 | 31.3 | 6.3 | 6.5 | 0.9 | 0 |
| Acrylic Resin 4 | 32.7 | 28.8 | 0 | 31.3 | 7.2 | 0 | 0 | 0 |
| Acrylic Resin 5 | 30.2 | 31.3 | 0 | 31.3 | 0 | 0 | 0 | 7.2 |
| Acrylic Resin 6 | 23.3 | 31.8 | 0 | 31.3 | 6.3 | 6.5 | 0.8 | 0 |

Phosmer M is a methacryloyloxyethyl phosphate (obtained from Yuni-chemicals, Japan, purity of 89%)

Invention Example 1

Positive-Working Multi-Layer Imageable Elements

Positive-working multi-layer imageable elements of the present invention were prepared as follows:

An inner layer coating formulation was prepared by dissolving either inventive Polymer A or B (6.01 g, TABLE I) in a solvent mixture of BLO (9.27 g), PGME (13.9 g), MEK (60.26 g), and water (9.27 g). IR Dye A (1.06 g) was then added to this solution followed by Byk® 307 (0.211 g). The resulting solution was coated onto Substrate A to achieve a 1.5 $g/m^2$ dry coating weight.

An outer layer coating formulation of RX-04 (4.971 g), ethyl violet (0.014 g), 10% Byk® 307 (0.149 g), DEK (85.38 g) and acetone (9.48 g) was coated over the inner layer to give a dry coating weight of 0.5 $g/m^2$.

The resulting invention imageable elements were thermally imaged on a conventional Kodak Trendsetter 3244 having a laser diode array emitting at 830 nm with a variety of exposure energies from 80 to 140 $mJ/cm^2$. The exposed elements were developed using 956 Developer in a NE-34 processor. The exposed areas were removed to reveal hydrophilic substrate. The resulting printing plates containing Polymers A or B exhibited good images at about 90 $mJ/cm^2$ exposure after development.

Other samples of the imageable elements (prepared either from Polymer A or Polymer B) were exposed at 100 and 120 mJ/cm$^2$ respectively on a Kodak Trendsetter 3244x and were developed using 956 Developer. The resulting printing plates were then directly mounted on an ABDick duplicator press charged with Van Son rubber-based black ink. The fountain solution was Varn 142W etch at 3 oz per gallon (23.4 ml/liter) and PAR alcohol replacement at 3 oz per gallon (23.4 ml/liter). The printing press was run at least 200 impressions with good quality. The chemical resistance results are shown below in TABLE II.

Comparative Example 1

Example 1 from U.S. Pat. No. 7,300,726

An imageable element outside of the present invention was prepared as follows:

An inner layer coating formulation was prepared by dissolving 3.834 g of Polymer E and 2.13 g of Polymer F in a solvent mixture of 9.27 g of BLO, 13.9 g of PGME, 60.27 g of MEK, and 9.27 g of water. IR Dye A (1.06 g) was then added to this solution followed by addition of 0.211 g of Byk® 307 (10% solution in PGME). The resulting solution was coated onto Substrate A to provide a 1.5 g/m$^2$ dry inner layer weight.

An outer layer formulation was prepared by mixing 1.503 g of P-3000, 3.469 g of PD-140, 0.014 g of ethyl violet, 0.149 g of 10% Byk® 307 in 85.38 g of DEK, and 9.48 g of acetone. This formulation was coated over the inner layer formulation described above to provide a dry outer layer weight of 0.5 g/m$^2$.

The resulting imageable element was thermally imaged on a commercially available Kodak Trendsetter 3244 having a laser diode array emitting at 830 nm with a variety of exposure energies from 60 to 140 mJ/cm$^2$. The resulting imaged element was developed with 956 Developer in a commercial processor. The minimum energy to achieve a desired image was about 100 mJ/cm$^2$.

The "Developer Clean Time" (that is, the time for completely or fully removing the inner layer with no outer layer present, when developer is applied) was also observed.

The solvent resistance and thermal bakeability of the elements containing the various Polymers in the inner were measured by following methods and their results were summarized in TABLE II below.

(a) BC drop test: A Butyl Cellosolve® solution (80% in water) was dropped onto the inner layer surface at regular intervals up to 15 minutes. The ratings used were: Excellent (no obvious coating damage up to 15 minutes), Good (no obvious coating damage up to 10 minutes), and Poor (obvious coating damage in 5 minutes).

(b) DAA drop test: A diacetone alcohol (80% in water) solution was dropped onto the inner layer surface at regular intervals up to 15 minutes. The ratings used were: Excellent (no obvious coating damage up to 15 minutes), Good (no obvious coating damage up to 10 minutes), and Poor (obvious coating damage in 5 minutes).

(c) Thermal Bakeability test: A PS plate image remover, PE-35 (from DIC, Japan), was applied onto the inner layer surface that had been baked at 220° C. for 2 minutes, at regular intervals up to 5 minutes. The ratings used were: Excellent (no obvious coating damage up to 5 minutes), Good (no obvious coating damage up to 1 minute), and Poor (obvious coating damage in 1 minute).

TABLE II

| Element | Developer Clean Time (seconds) | BC drop test | DAA drop test | Thermal Bakeability |
|---|---|---|---|---|
| Example 1 (Polymer A) | 15 | Excellent | Excellent | Excellent |
| Example 1 (Polymer B) | 10 | Excellent | Excellent | Excellent |
| Comparative Example 1 (Polymers E and F) | 10 | Excellent | Poor | Excellent |

The results in Table II show that use of the polymers containing recurring units derived from the Structure I provided improved solvent resistance and thermal bakeability, especially in DAA drop test. The inventive polymers can be used as single binders to replace the dual binder composition in Comparative Example 1.

Invention Example 2

Positive-Working Single-Layer Imageable Elements

Single-layer imageable elements of the present invention were prepared by dissolving the ingredients for Formulations 1, 2, 3, and 4 shown in the following TABLE III containing Polymers A-D as the inventive polymeric binders.

Comparative Example 2

Positive-Working Single-Layer Imageable Elements Without Inventive Polymers

Positive-working single-layer imageable elements outside of the present invention were prepared by dissolving the ingredients for Formulation 5 shown in the following TABLE III.

TABLE III

| Ingredient | Example 2 Formulation 1 (gram) | Example 2 Formulation 2 (gram) | Example 2 Formulation 3 (gram) | Example 2 Formulation 4 (gram) | Comparative Ex. 2 Formulation 5 (gram) |
|---|---|---|---|---|---|
| LB6564 | 0.59 | 0.57 | 0.59 | 0.59 | 0.73 |
| PD494 | 0 | 0 | 0 | 0 | 0.29 |
| Durez 33816 | 0.47 | 0.61 | 0.47 | 0.47 | — |
| Polymer Binder | Polymer A (0.17) | Polymer B (0.11) | Polymer C (0.17) | Polymer D (0.17) | Cellulose acetate hydrogen phthalate (0.02)* |
| XDSA | 0.07 | 0.07 | 0.07 | 0.07 | — |
| Basonyl violet | 0.02 | 0.02 | 0.02 | 0.02 | 0.02 |
| IR Dye B | 0.01 | 0.01 | 0.01 | 0.01 | 0.006 |
| IR Dye A | 0.02 | 0.02 | 0.02 | 0.02 | 0.01 |

TABLE III-continued

| Ingredient | Example 2 Formulation 1 (gram) | Example 2 Formulation 2 (gram) | Example 2 Formulation 3 (gram) | Example 2 Formulation 4 (gram) | Comparative Ex. 2 Formulation 5 (gram) |
|---|---|---|---|---|---|
| Silikophen P50X | — | — | — | — | 0.14 |
| Byk ® 307 (10%) | 0.06 | 0.06 | 0.06 | 0.06 | 0.04 |
| MEK | 9.23 | 7.54 | 10.92 | 10.92 | 3.36 |
| PGME | 2.31 | 3.94 | 2.31 | 2.31 | 13.38 |
| BLO | 3.38 | 3.38 | 1.69 | 1.69 | — |
| Water | 1.69 | 1.69 | 1.69 | 1.69 | — |

*From Sigma-Aldrich, is used as solvent resistant component.

All formulations were coated on Substrate A to obtain a dry coating weight of 1.50 g/m$^2$ for all elements by means of a Meyer bar. The solvents were removed by drying at a temperature of 123° C. for 50 seconds. After the imageable elements were coated and dried, they were conditioned at a temperature of 55° C. and a relative humidity of 80% RH for 72 hours.

After conditioning, the imageable elements were imaged using a conventional Kodak Trendsetter 3244, followed by development in a Mercury of the Americas processor (Eastman Kodak Company) containing commercially available GoldStar® Plus developer at 23° C. at a processing speed of 750 mm/min.

The digital imaging speed and solvent resistance of the imageable elements were determined using the following methods. The results are summarized in TABLE IV below.

The digital imaging speed of the plates was defined as the level of exposure (as measured in mJ/cm$^2$) that is required to clean out a region of a 50% checkerboard pattern as determined using a D196 densitometer (Gretag MacBeth, Regensdorf, Switzerland).

Solvent resistance was measured by reading the ΔOD (Δ optical density) of a solid area before and after soaking in a concentrated fountain solution for 8 hours. The concentrated fountain solution consisted of 6% of Astro Mark 3 fountain additive (Nikken Chemical Ltd., Tokyo, Japan), 10% of isopropyl alcohol (Sigma-Aldrich St Louis, Mo.), and 84% of water purified by reverse osmosis.

TABLE IV

| Formulation | Digital Speed (mJ/cm$^2$) | Solvent Resistance (ΔOD) |
|---|---|---|
| 1 | 90 | −0.06 |
| 2 | 110 | −0.08 |
| 3 | 90 | −0.05 |
| 4 | 90 | −0.04 |
| 5 | 160 | −0.15 |

These results show that the use of all four of Polymers A, B, C and D in Formulations 1-4 improved the chemical resistance of the resulting coatings (that is, there was little change in OD before and after soaking in the fountain solution) compared to the use of Formulation 5 for the Comparative Example 2 element.

Invention Examples 3-5 and Comparative Examples 3-5

Multi-layer imageable elements of this invention were prepared using the formulations shown below in TABLES V (Inner Layer) and VIII (Outer Layer) and the Acrylic Resins of TABLE VI. Similar imageable elements for Comparative Examples 3-5 were prepared using the formulations shown below in TABLES V (Inner Layer) and VIII (Outer Layer) and the resins of TABLE VII. The inner layer formulations were applied to Substrate B using a roll coater and dried for 2 minutes at 100° C. to provide a dry coating weight of 1.5 g/m$^2$. The outer layer formulations were then similarly applied and dried to provide a dry coating weight of 0.5 g/m$^2$.

TABLE V

| Component | Amount (g) |
|---|---|
| Methyl ethyl ketone | 47.28 |
| Propylene glycol 1-monomethyl ether | 28.37 |
| γ-Butyrolactone | 9.46 |
| Water | 9.46 |
| Acrylic Resin (see TABLE VI or VII) | 3.95 |
| IR Dye A | 0.50 |
| IR Dye B | 0.40 |
| D11 | 0.10 |
| Paintad 19 | 0.05 |

TABLE VI

| Element | Acrylic Resin of TABLE V |
|---|---|
| Invention Example 3 | Acrylic Resin 1 |
| Invention Example 4 | Acrylic Resin 2 |
| Invention Example 5 | Acrylic Resin 3 |

TABLE VII

| Element | Acrylic Resin of TABLE V |
|---|---|
| Comparative example 1 | Acrylic Resin 4 |
| Comparative example 2 | Acrylic Resin 5 |
| Comparative example 3 | Acrylic Resin 6 |

TABLE VIII

| Component | Amount (g) |
|---|---|
| Methyl isobutyl ketone | 66.32 |
| Acetone | 19.00 |
| Propylene glycol 1-monomethyl ether 2-acetate | 9.50 |
| SMA resin (average MW 2,000) | 4.93 |
| BOH-M | 0.02 |
| Paintad 19 | 0.05 |

A developer formulation was prepared having the components of the following TABLE IV. Its pH was 11.5 and its conductivity was 1.2 mS/cm.

TABLE IX

| Component | Amount (g) |
|---|---|
| Deionized water | 700 |
| Monoethanolamine | 10 |
| Diethanolamine | 30 |
| Pelex NBL | 200 |
| Benzyl alcohol | 60 |

The prepared imageable elements were exposed to IR radiation (PT-R4300, Dainippon screen) at 150 mJ/$cm^2$ and developed in a processor having two molten rollers in the developer tank (PK-910II Kodak Graphics Communications of Japan, Gunma) using the Developer of TABLE IX (diluted 1 to 4 with water) (30° C. for 15 seconds).

And after development, the resulting printing plates were evaluated in several respects. The printing plates were first baked at 190° C. for 2 minutes and at 240° C. for 2, 5, and 10 minutes. The solvent resistance of the printing plates after this baking was evaluated both before and after baking using a common chemical solution, plate image remover PE3S (available from Kodak Graphic Communications of Japan, Gunma). The results of these evaluations are provided in TABLE X below. The Solvent Resistance times (minutes) shown in TABLE X are the times before the printing plate surface was attacked with PE3S with the longer times being better than the shorter times (for example, <2 minutes is the worst result). The resolution was also evaluated visually (through a 50× microscope) having a high quality image with smooth scan lines in both the horizontal and vertical directions, with the higher value (5) being the best.

TABLE X

| | | Solvent Resistance with PE3S | | | | |
|---|---|---|---|---|---|---|
| | | | After Baking | | | |
| | Resolution | Before Baking | 190° C., 2 minutes | 240° C., 2 minutes | 240° C., 5 minutes | 240° C., 10 minutes |
| Invention Example 3 | 5 | <2 minutes | 4 minutes | 8 minutes | >10 minutes | >10 minutes |
| Invention Example 4 | 5 | <2 minutes | 4 minutes | 6 minutes | >10 minutes | >10 minutes |
| Invention Example 5 | 4 | <2 minutes | 2 minutes | 4 minutes | 8 minutes | >10 minutes |
| Comparative Example 3 | 4 | <2 minutes | <2 minutes | <2 minutes | <2 minutes | <2 minutes |
| Comparative Example 4 | 4 | <2 minutes | <2 minutes | <2 minutes | <2 minutes | <2 minutes |
| Comparative Example 5 | 3 | <2 minutes | <2 minutes | <2 minutes | <2 minutes | <2 minutes |

The results shown in TABLE X indicate that printing plates obtained from the imageable elements of this invention containing the inventive polymeric binders (Invention Examples 3-5) had good solvent resistance and scratch resistance. The printing plates obtained from Comparative Example 3-5 imageable elements did not.

The invention has been described in detail with particular reference to certain preferred embodiments thereof, but it will be understood that variations and modifications can be effected within the spirit and scope of the invention.

The invention claimed is:

1. A positive-working imageable element that is a positive-working lithographic printing plate precursor comprising a substrate having a hydrophilic surface, and having thereon an imageable layer that is soluble in an alkaline developer only after exposure to infrared imaging radiation, the imageable layer comprising a first polymeric binder that is soluble in an alkaline developer upon exposure to imaging radiation, said element further comprising an infrared radiation absorbing compound, wherein said first polymeric binder comprises a backbone to which are attached pendant groups represented by the following Structure (I):

(I)

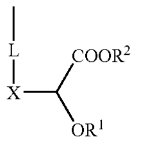

wherein $R^1$ and $R^2$ are independently hydrogen or alkyl groups having 1 to 8 carbon atoms or aryl groups having 6 or 10 carbon atoms in the carbocyclic ring, L is a direct bond or a linking group having at least 1 carbon atom and optionally one or more nitrogen, oxygen, and sulfur atoms in the linking chain, and X is oxy, thio, or —NR— wherein R is hydrogen or an alkyl group having 1 to 8 carbon atoms or an aryl group having 6 or 10 carbon atoms in the carbocyclic ring.

2. The element of claim 1 wherein each of $R^1$ and $R^2$ is hydrogen, L is a direct bond or a linking group comprising one or more alkylene, arylene, —C(═O)—, —OC(═O)—, —NR(C═O)—, or —S(═O)O— groups, or any combination thereof, wherein R is hydrogen or an alkyl group having 1 to 4 carbon atoms, and X is oxy or —NR—.

3. The element of claim 2 wherein L is a direct bond or a linking group comprising one or more alkylene groups having 1 to 4 carbon atoms, —C(═O)—, or —S(═O)O— groups, and X is oxy or —NH—.

4. The element of claim 1 wherein said first polymeric binder can be represented by the following Structure (II):

$$-(A)_x-(B)_y- \quad (II)$$

wherein A represents recurring units comprising the pendant groups represented by Structure (I), B represents recurring units that do not have pendant groups represented by Structure (I), x is from about 3 to 100 weight %, and y is 0 to about 97 weight %.

5. The element of claim 4 wherein B represents recurring units derived from one or more monomers selected from the group consisting of styrenic monomers, vinyl carbazole, (meth)acrylamides, (meth)acrylic acids or esters thereof, (meth)acrylonitriles, vinyl acetate, maleic anhydride, N-substituted phenylmaleimide, vinyl pyridine, vinyl pyrrolidone, and vinyl trimethoxysilane, or any combination thereof.

6. The element of claim 1 wherein said layer is the only imageable layer and comprises said first polymeric binder that is present in an amount of from about 1 to about 30 weight %, and said infrared radiation absorbing compound is present in an amount of from about 0.5 to about 30 weight %.

7. The imageable element of claim 1 that comprises, on said substrate, in order:

an inner layer comprising said infrared radiation absorbing compound that is an infrared radiation sensitive compound that is present in an amount of from about 0.5 to about 30 weight %, and said first polymeric binder that is present in said inner layer in an amount of from about 50 to about 99.5 weight %, and an ink receptive outer layer comprising a second polymeric binder that is different than said first polymeric binder, and is soluble or dispersible in an alkaline developer only after exposure to imaging radiation.

8. A positive-working, single-layer, infrared radiation-sensitive imageable element comprising a hydrophilic aluminum-containing substrate having thereon an imageable layer comprising an infrared radiation absorbing dye in an amount of from about 1 to about 30 weight %, and a first polymeric binder in an amount of from about 5 to about 20 weight % and that is represented by the following Structure (II):

$$-(A)_x-(B)_y- \qquad (II)$$

wherein A represents recurring units comprising the pendant groups represented by Structure (I) below, x is from about 10 to about 70 weight %, and y is from about 30 to about 90 weight %, (I)

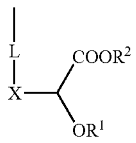

wherein $R^1$ and $R^2$ each hydrogen, L is a direct bond or a linking group comprising one or more alkylene groups having 1 to 4 carbon atoms, —C(═O)—, or —S(═O)O— groups, and X is oxy or —NH—, and B represents recurring derived from one or more monomers selected from the group consisting of styrenic monomers, vinyl carbazole, (meth)acrylamides, (meth) acrylic acids or esters thereof, (meth)acrylonitriles, vinyl acetate, maleic anhydride, N-substituted phenylmaleimide, vinyl pyridine, vinyl pyrrolidone, and vinyl trimethoxysilane, or any combination thereof.

9. The element of claim 8 wherein the A recurring units are derived from one or more monomers selected from the group consisting of the following ethylenically unsaturated polymerizable monomers (A1) through (A5):

(A1)

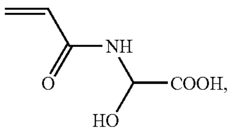

-continued (A2)

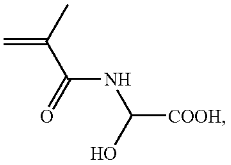

(A3)

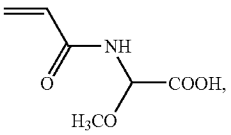

(A4)

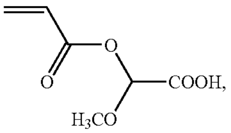

and (A5)

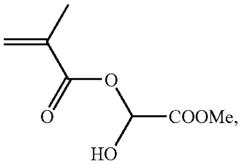

and the B recurring units are derived from one or more styrenic monomers, N-phenylmaleimide, (meth)acrylonitrile, and (meth)acrylamide.

10. A positive-working, multi-layer, infrared radiation-sensitive imageable element comprising a hydrophilic aluminum-containing substrate having thereon:

an inner layer comprising an infrared radiation absorbing compound that is present in an amount of from about 1 to about 30 weight %, and a first polymeric binder that is present in an amount of from about 60 to about 90 weight %, and an ink receptive outer layer comprising a second polymeric binder that is different than said first polymeric binder, and is soluble or dispersible in an alkaline developer only after exposure to imaging radiation, said first polymeric binder being represented by the following Structure (II):

$$-(A)_x-(B)_y- \qquad (II)$$

wherein A represents recurring units comprising the pendant groups represented by Structure (I) below, x is from about 10 to about 70 weight %, and y is from about 30 to about 90 weight %, (I)

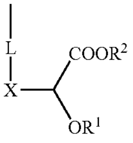

wherein $R^1$ and $R^2$ each hydrogen, L is a direct bond or a linking group comprising one or more alkylene groups having 1 to 4 carbon atoms, —C(═O)—, or —S(═O)O— groups, and X is oxy or —NH—, and B represents recurring derived from one or more monomers selected from the group consisting of styrenic monomers, vinyl carbazole, (meth)acrylamides, (meth)

acrylic acids or esters thereof, (meth)acrylonitriles, vinyl acetate, maleic anhydride, N-substituted phenyl-maleimide, vinyl pyridine, vinyl pyrrolidone, and vinyl trimethoxysilane, or any combination thereof.

11. The element of claim 10 wherein the A recurring units are derived from one or more monomers selected from the group consisting of the following ethylenically unsaturated polymerizable monomers (A1) through (A5):

(A1)

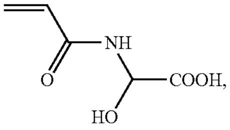

(A2)

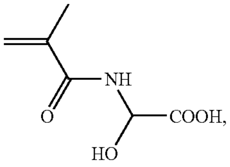

-continued (A3)

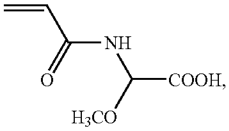

(A4)

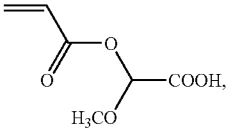

and (A5)

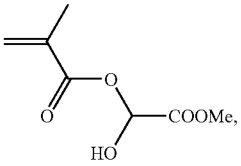

and the B recurring units are derived from one or more styrenic monomers, N-phenylmaleimide, (meth)acrylonitrile, and (meth)acrylamide.

* * * * *